(12) United States Patent
Jung et al.

(10) Patent No.: US 11,888,101 B2
(45) Date of Patent: Jan. 30, 2024

(54) DISPLAY PANEL

(71) Applicant: SAMSUNG ELECTRONICS CO., LTD., Suwon-si (KR)

(72) Inventors: Youngki Jung, Suwon-si (KR); Jinho Kim, Suwon-si (KR); Dongmyung Son, Suwon-si (KR); Sangmin Shin, Suwon-si (KR); Changjoon Lee, Suwon-si (KR); Kyungwoon Jang, Suwon-si (KR); Seongphil Cho, Suwon-si (KR); Gyun Heo, Suwon-si (KR); Soonmin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/259,681

(22) PCT Filed: Jul. 11, 2019

(86) PCT No.: PCT/KR2019/008540
§ 371 (c)(1),
(2) Date: Jan. 12, 2021

(87) PCT Pub. No.: WO2020/017820
PCT Pub. Date: Jan. 23, 2020

(65) Prior Publication Data
US 2021/0135076 A1    May 6, 2021

(30) Foreign Application Priority Data
Jul. 16, 2018   (KR) .................... 10-2018-0082527

(51) Int. Cl.
*H01L 33/62*    (2010.01)
(52) U.S. Cl.
CPC .................................. *H01L 33/62* (2013.01)

(58) Field of Classification Search
CPC ..... H01L 33/62; H01L 27/124; H01L 25/167; H01L 25/0753; G02F 1/133; H10K 59/00
See application file for complete search history.

(56) References Cited

U.S. PATENT DOCUMENTS 6,025,901 A * 2/2000 Adachi ............... G02F 1/13452
349/158
7,839,479 B2  11/2010 Choi
(Continued)

FOREIGN PATENT DOCUMENTS

| CN | 1722452 A | 1/2006 |
| CN | 108267901 A | 7/2018 |

(Continued)

OTHER PUBLICATIONS

Communication dated Jul. 13, 2021, from the European Patent Office in European Application No. 19837589.1.
(Continued)

*Primary Examiner* — Latanya N Crawford Eason
(74) *Attorney, Agent, or Firm* — Sughrue Mion, PLLC

(57) ABSTRACT

A display panel is disclosed. The disclosed display panel includes a thin film transistor substrate, a plurality of micro LEDs arranged on one surface of the thin film transistor substrate, a plurality of first connection pads disposed on the one surface of the thin film transistor substrate, a plurality of second connection pads disposed on the other surface of the thin film transistor substrate that faces the one surface, and a plurality of connection wirings disposed on a side surface of the thin film transistor substrate for electrically connecting each of the plurality of first connection pads and the plurality of second connection pads, wherein at least one of an edge region on the one surface and an edge region on the (Continued)

other surface of the thin film transistor substrate includes a cutting area which is cut in an inward direction of the thin film transistor substrate.

8 Claims, 11 Drawing Sheets

(56) References Cited

U.S. PATENT DOCUMENTS

| | | |
|---|---|---|
| 8,549,738 B2 | 10/2013 | Grunthaner |
| 10,468,396 B2 | 11/2019 | Kim et al. |
| 10,593,743 B2 | 3/2020 | Son et al. |
| 10,935,828 B2 | 3/2021 | Jeong et al. |
| 11,398,538 B2 | 7/2022 | Son et al. |
| 11,487,143 B2 | 11/2022 | Jeong et al. |
| 2003/0197475 A1 | 10/2003 | Takamura et al. |
| 2006/0001792 A1 | 1/2006 | Choi |
| 2007/0034402 A1* | 2/2007 | Cheng ................. G02F 1/13452 174/268 |
| 2012/0322334 A1 | 12/2012 | Kurihara et al. |
| 2015/0021570 A1 | 1/2015 | Kim et al. |
| 2015/0036300 A1 | 2/2015 | Park et al. |
| 2018/0069072 A1 | 3/2018 | Kajiyama et al. |
| 2018/0188579 A1 | 7/2018 | Jeong et al. |
| 2018/0190631 A1 | 7/2018 | Kim et al. |
| 2018/0190747 A1 | 7/2018 | Son et al. |
| 2019/0067630 A1* | 2/2019 | Hwang ............... H01L 51/5246 |
| 2020/0176537 A1 | 6/2020 | Son et al. |
| 2021/0149235 A1 | 5/2021 | Jeong et al. |
| 2023/0016880 A1 | 1/2023 | Jeong et al. |

FOREIGN PATENT DOCUMENTS

| | | |
|---|---|---|
| CN | 108269823 A | 7/2018 |
| CN | 108267903 A | 7/2023 |
| EP | 3 343 273 A2 | 7/2018 |
| EP | 3 343 274 A2 | 7/2018 |
| EP | 3 343 551 A1 | 7/2018 |
| EP | 3 422 827 A1 | 1/2019 |
| JP | H6-113214 A | 4/1994 |
| JP | 2003-295782 A | 10/2003 |
| JP | 2012198255 A | 10/2012 |
| JP | 2015-175969 A | 10/2015 |
| KR | 10-0205939 B1 | 7/1999 |
| KR | 10-0480754 B1 | 7/2005 |
| KR | 10-2013-0114955 A | 10/2013 |
| KR | 10-2018-0079079 A | 7/2018 |
| KR | 10-2018-0079080 A | 7/2018 |

OTHER PUBLICATIONS

International Search Report (PCT/ISA/210) dated Oct. 17, 2019 by the International Searching Authority in counterpart International Patent Application No. PCT/KR2019/008540.

Written Opinion (PCT/ISA/237) dated Oct. 17, 2019 by the International Searching Authority in counterpart International Patent Application No. PCT/KR2019/008540.

Communication dated Aug. 29, 2022 issued by the Korean Patent Office for Korean Patent Application No. 10-2018-0082527.

Communication dated Sep. 21, 2023 issued by the Chinese Patent Office in counterpart Chinese Application No. 201980046966.X.

* cited by examiner

DISPLAY PANEL

TECHNICAL FIELD

This disclosure relates to a display panel and, more specifically, to a display panel which minimizes a bezel area of a substrate by disposing a structure of connection wiring in an edge area of a substrate to move a bonding area of a driver integrated circuit (IC) to a back side of the substrate.

BACKGROUND ART

A display device displays various colors while operating on pixels or sub-pixel units. An operation is controlled by each pixel or a sub-pixel thin film transistor (TFT). A plurality of TFTs are arranged on a flexible substrate, a glass substrate, or a plastic substrate, and is referred to as a thin film transistor substrate.

The TFT substrate is used as a substrate for driving a display from a flexible device, a small-sized wearable device (e.g., a wearable watch, or the like) to a large-sized television (TV) up to several inches.

In order to drive a TFT, the TFT is connected to an external IC or a driver IC which is capable of applying a current to the TFT substrate. In general, the thin TFT substrate and each circuit are connected through a chip on glass (COG) bonding or a film on glass (FOG) bonding, or the like. For this connection, an area having a predetermined space on an edge of the TFT substrate, that is, a bezel area, needs to be secured.

Recently, there is a display panel to which technology to reduce a bezel area or bezelless technology to remove the bezel area is applied so that an area where an image is displayed on a display, that is, an active area, can be maximized.

DISCLOSURE

Technical Problem

In a bezelless display panel, side wirings connecting the TFT substrate and the driver IC are formed along the edge of the TFT substrate, but there is a problem in that the thickness of the side wirings is not constant by an edged portion of the edge.

Technical Solution

The objective of the disclosure is to provide a display panel which improves uniformity of a thickness of connection wirings and the stability of the connection wirings disposed on a side surface of the TFT substrate.

The disclosure provides a display panel including a thin film transistor substrate, a plurality of micro light emitting diodes (LEDs) arranged on one surface of the thin film transistor substrate, a plurality of first connection pads disposed on the one surface of the thin film transistor substrate, a plurality of second connection pads disposed on the other surface of the thin film transistor substrate that faces the one surface, and a plurality of connection wirings disposed on a side surface of the thin film transistor substrate for electrically connecting each of the plurality of first connection pads and the plurality of second connection pads, and at least one edge area of an edge area on the one surface and an edge area on the other surface of the thin film transistor substrate may include a cutting area which is cut in an inward direction of the thin film transistor substrate.

The cutting area may be formed to be inclined.

The cutting area may be formed to be curved.

The cutting area may be formed to have a multi-stage.

The cutting area may be disposed on an area where the plurality of connection wirings are disposed among the edge areas of the thin film transistor substrate.

The plurality of first connection pads may be disposed at a preset interval along a length direction of an edge area of the one surface, respectively and the plurality of second connection pads may be disposed to face the plurality of first connection pads, respectively.

The cutting area may be consecutively formed along a length direction of the edge area of the thin film transistor substrate.

The cutting area may include at least one cutting surface, and the connection wirings may be consecutively formed on the one surface, the other surface, and the cutting surface.

The connection wirings may include a shape corresponding to a shape of the cutting surface.

BEST MODE FOR CARRYING OUT THE INVENTION

Figure 1:
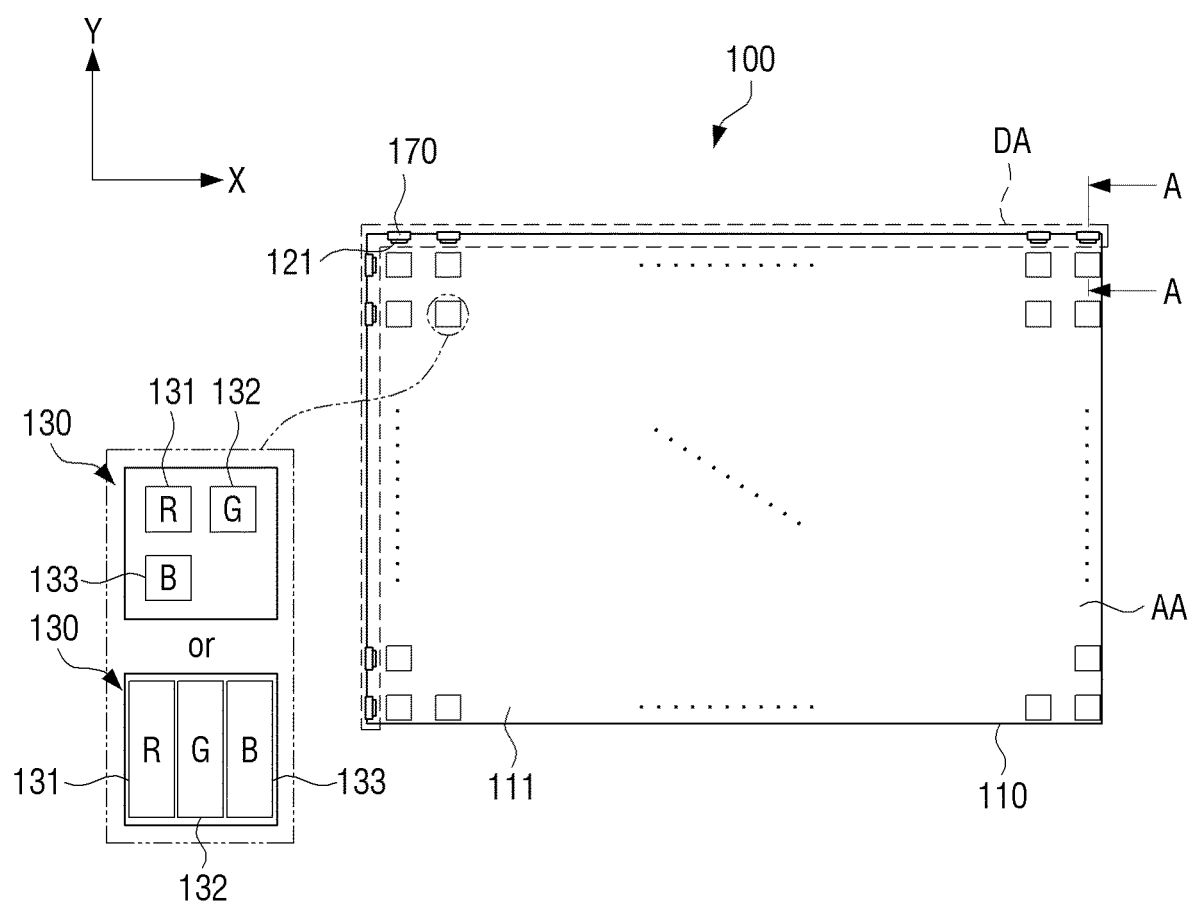
FIG. 1 is a front diagram illustrating a display panel according to an embodiment.

Examples described hereinafter are for easy understanding of the disclosure, and it should be understood that various changes can be made to examples described herein and the disclosure can be embodied in different forms and various modifications can be made. It should be understood, however, that the description of the embodiments is provided to enable the disclosure of the disclosure to be complete. In the accompanying drawings, the elements may be enlarged in size for convenience of explanation and the proportions of the elements can be exaggerated or reduced.

It will be understood that when an element is referred to as being "on" or "connected to" another element, the element may be directly connected to the other element or intervening elements may also be present. Further, when an element is referred to as being "directly on" or "directly connected to" another element, no intervening elements may be present. Other expressions describing relationships between components such as "between" and "directly adjacent to" may be construed in a similar manner as "connected to" and "directly connected to," respectively.

The terms such as "first," "second," etc., may be used to describe a variety of elements, but the elements should not be limited by these terms. The terms may be used to distinguish an element from another element. The use of such ordinal numbers should not be construed as limiting the meaning of the term. For example, without departing from the scope of the disclosure, a "first component" may be referred to as a "second component," and similarly, the "second component" may also be referred to as a "first component."

Singular forms in the disclosure may include the plural forms as well, unless the context clearly indicates otherwise. It will be further understood that terms such as "including," "having," etc., may indicate the existence of the features, numbers, operations, actions, components, parts, or combinations thereof, disclosed in the specification, and are not intended to preclude the possibility that one or more other features, numbers, operations, actions, components, parts, or combinations thereof, may exist or may be added.

Unless otherwise defined, all terms used herein have the same meaning as commonly understood by one of ordinary skill in the art to which this disclosure pertains.

According to the embodiments, a display panel can electrically connect a plurality of light emitting devices arranged on a front surface of a thin film transistor substrate (hereinafter "TFT substrate") and a plurality of circuits arranged on a back surface of the TFT substrate by forming connection wirings on an edge area of the TFT substrate.

The edge area of the TFT substrate can be the outermost portion of the TFT substrate. The edge area of the TFT substrate can be a dummy area ranging from the outermost portion of the TFT substrate to an active area on which the image is displayed. Therefore, the dummy area can include a side end surface of the TFT substrate, and a front portion and a rear portion of the TFT substrate adjacent to the side end surface.

The light emitting device may be a micro light emitting diode (LED), in which case each micro LED forms a red (R) color sub-pixel, a green (G) color sub-pixel, and a blue (B) color sub-pixel. A single pixel can be composed of three R, G, and B sub-pixels, and each TFT of the TFT substrate may be formed in a server pixel unit.

The light emitting device is not limited to the micro LED having a size of 100 μm or below, and can be an LED of various scales when necessary.

The LED may be a light emitting device representing various colors including white light.

Figure 2:
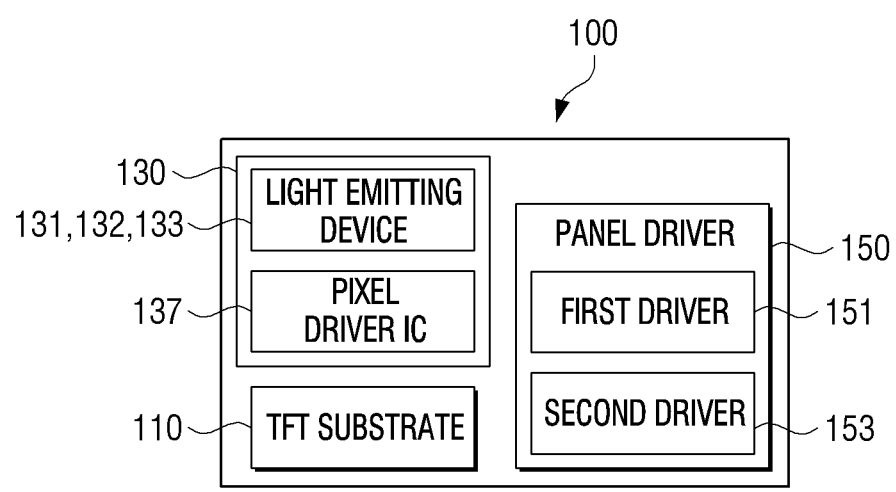
FIG. 2 is a block diagram illustrating a display panel according to an embodiment.

FIG. 1 is a front diagram illustrating a display panel 100 according to an embodiment, and FIG. 2 is a block diagram illustrating the display panel 100 according to an embodiment.

Hereinbelow, with reference to FIGS. 1 and 2, a structure of the display panel 100 will be further described.

The display panel 100 according to one embodiment may include a TFT substrate 110 on which a plurality of pixel driving circuits 137 are formed, a plurality of pixels 130 arranged on a front surface (hereinafter one surface 111) of the TFT substrate, a panel driver 150 for generating a control signal and providing the control signal to each pixel driver IC 137 formed on the TFT substrate 110, and connection wirings 170 formed on an edge area (DA) of the TFT substrate to electrically connect the pixel driver IC 137 and the panel driver 150.

Referring to FIGS. 1 and 2, a TFT substrate 110 can be formed with a plurality of data signal lines arranged horizontally and a plurality of gate signal lines arranged vertically to control a plurality of pixels 30 arranged on one surface 111 of the TFT substrate.

The one surface 111 of the TFT substrate can be divided into an active area (AA), which can display an image through a plurality of pixels 130 and a dummy area (DA) which is the remaining area except the active area. In this case, the DA can correspond to an edge area of the TFT substrate 110, and in this disclosure, the dummy area (DA) and the edge area of the TFT substrate 110 are considered the same configurations.

As illustrated in FIG. 1, the plurality of pixels 130 may be arranged in a matrix form on one surface 111 of the TFT substrate 110.

Each pixel 130 may include three R, G, and B sub-pixels 131, 132, and 133 corresponding to red, green, and blue colors.

Each sub-pixel 131, 132, 133 can be composed of a micro light emitting diode (LED) emitting the color of the corresponding sub-pixel. In the disclosure, "sub-pixel" and "micro LED" are treated as the same configurations.

R, G, and B sub-pixels 131, 132, and 133 may be arranged in one pixel 131 in a matrix form or sequentially arranged.

The arrangement format of the sub-pixel is one example, and R, G, and B sub-pixels 131, 132, and 133 can be disposed in various forms in each single pixel 130.

Each single pixel 130 may include a pixel driver IC for driving a micro LED corresponding to R, G, and B sub-pixels 131, 132, 133, respectively.

One of the plurality of pixels 130 in the disclosure may be defined to include three pixel driver ICs 137 for driving red (R), green (G), and blue (B) sub-pixels 131, 132, and 133, respectively.

The panel driver 150 may be connected to the TFT substrate 110 by COG bonding or FOG bonding.

The panel driver 150 can control the light emission of a plurality of micro LEDs 131, 132, 133 electrically connected to each of the plurality of pixel driver ICs 137 by driving a plurality of pixel driver ICs 137.

The panel driver 150 may control a plurality of pixel driver ICs through the first driver 151 and the second driver 153.

The first driver 131 may generate a control signal for sequentially controlling a plurality of horizontal lines formed on the one surface 111 of the TFT substrate by one line per the image frame, and may transmit the generated control signal to a pixel driver IC connected to the corresponding line.

The second driver 153 may generate a control signal for sequentially controlling a plurality of vertical lines formed on the one surface 111 of the TFT substrate by one line per the image frame, and may transmit the generated control signal to a pixel driver IC 137 connected to the corresponding lines.

Figure 3:
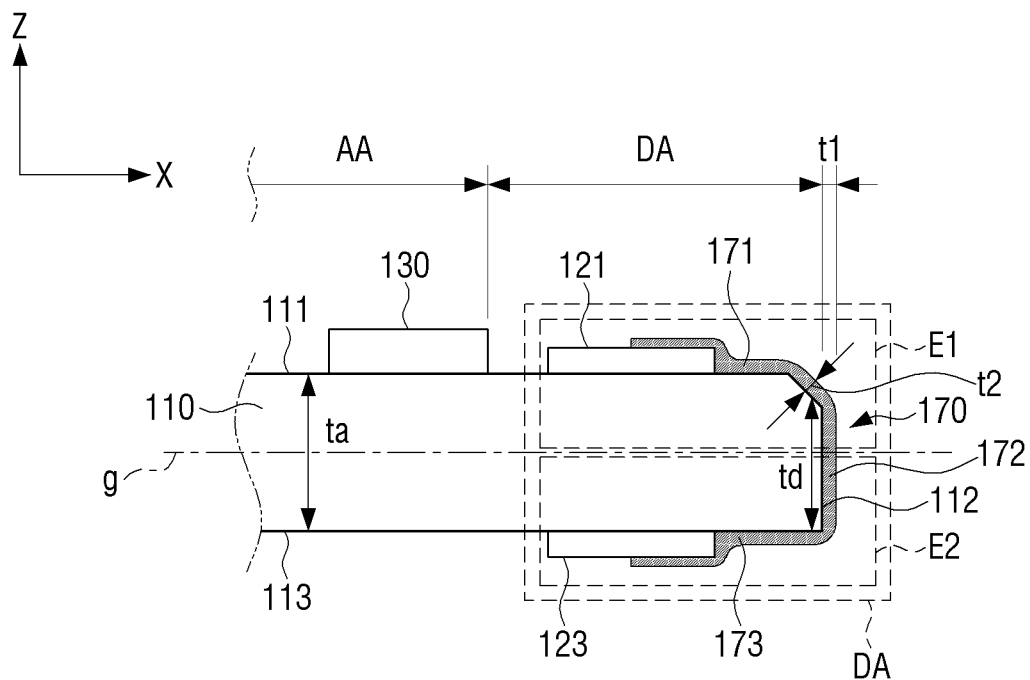
FIG. 3 is a cross-sectional view illustrated along A-A line of FIG. 2.

FIG. 3 is a cross-sectional view illustrated along A-A line of FIG. 2.

Referring to FIG. 3, a specific structure of the edge area (DA) of the TFT substrate 110 will be described.

Connection wirings 170 may be arranged on the edge area (DA) of the TFT substrate 110 to electrically connect a first connection pad or contact pad 121 formed on the one surface 111 of the TFT substrate 110 and a second connection pad or contact pad 123 formed on the other surface 113 facing the one surface 111 of the TFT substrate 110.

The edge area (DA) of the TFT substrate may refer to a portion of the edge of the one surface 111 of the TFT substrate, a portion of an edge of the other surface 113, and an area including the side surface 112 of the TFT substrate.

The edge area (DA) of the TFT substrate 110 can be an area including an edge area E1 of the one surface 111 of the TFT substrate 110 and an edge area E2 of the other surface 113 of the TFT substrate.

The connection wirings 170 may be formed in plural with a predetermined interval along the edge area (DA) of the TFT substrate 110.

In this case, the first connection pad 121 can be formed in plural with a predetermined interval along an upper side of the one surface 111 of the TFT substrate and the left side of the one surface 111 of the TFT substrate.

Referring to FIG. 1, an upper side may refer to a portion including an edge located in an upward direction (the z-axis direction) of the TFT substrate 110. In addition, the left side may refer to a portion including an edge located in the upper left portion.

The plurality of first connection pads 121 can be electrically connected to the gate signal wiring, and the plurality of first connection pads 121 arranged along the left side of the one surface 111 of the TFT substrate may be electrically connected to the data signal wiring.

The plurality of first connection pads 121 can be arranged at predetermined intervals along a length direction of an edge area (E1) of the one surface 111 of the TFT substrate.

The plurality of second connection pads 123 can be arranged opposite to a plurality of first connection pads 121 along the length direction of the edge area (E2) of the other surface 113 of the TFT substrate.

The connection wirings 170 which electrically connect the first connection pad 121 and the second connection pad 123 arranged to face each other may be formed at a shortest distance and may reduce the loss of current and signal.

One end of the connection wirings 170 can be electrically connected to the first connection pad 121 and the other end can be electrically connected to the second connection pad 123 so that the first connection pad 121 of the one surface 111 of the TFT surface and the second connection pad 123 of the other surface 113 of the TFT substrate 110 can be electrically connected with each other.

Specifically, the connection wirings 170 can include a first portion 171 formed on the one surface 111 of the TFT substrate in the edge area (DA) of the TFT substrate 110, a second portion 172 formed on the side surface 112 of the TFT substrate, and a third portion 173 formed on the other surface 113 of the TFT substrate. In this case, the second portion 172 of the connection wirings 170 is formed on the side surface 112 of the TFT substrate so that the second portion can be protruded by a first thickness t1 of the connection wirings 170 from the side surface 112 of the TFT substrate.

More specifically, the first portion 171 may partially contact the first connection pad 121 and cover a portion of the first connection pad 121, and the third portion 173 may contact in part of the second connection pad 123 and cover a portion of the second connection pad 123.

A separate protective layer (not shown) can be stacked on the connection wirings 170 to prevent disconnection of the second portion 172 of the connection wirings 170 formed in a state of protruding on the side surface 112 of the TFT substrate. The thickness of the protective layer can be formed to a thickness equal to or less than the thickness of the connection wirings 170.

The connection wirings 170 may be conductive materials and can be formed in an edge area (DA) of the TFT substrate 110 in various ways, such as an ink jet method, a screen printing method, a metal deposition method, or the like.

The edge area (DA) of the TFT substrate 110 can include the one surface 111, the side surface 112, the other surface 113 arranged to face the one surface 111, and a first cutting area or cutting surface 181a arranged between the one surface 111 and the side surface 112.

At least one edge area between an edge area (E1) of the one surface 111 and an edge area (E2) of the other surface 113 of the TFT substrate may include a cutting area (CA, FIG. 7) which is cut in the inner direction of the TFT substrate 110.

The inward direction of the TFT substrate 110 may refer to a direction which is close to a central line g of the TFT substrate 110 and is close to an active area (AA).

The cutting area (CA) may include at least one cutting surface 180. The cutting surface 180 can include first to fifth cutting surfaces 180a, 180b, 181a, 181b, 182a, 182b, and 183, which are described below.

The cutting surface 180 may be formed through a chemical method such as wet-type etching and dry-type etching, or the like, and may be formed through a mechanical method such as a lathe, milling, or the like.

The cutting area (CA) may be formed to be inclined by a predetermined angle with respect to at least one of the one surface 111 and the other surface 113 of the TFT substrate 110.

As shown in FIG. 3, the cutting area (CA) may include a first cutting surface 181a formed to be inclined at a certain angle with respect to one surface 111 of the TFT substrate 110.

The angle of inclination of the first cutting surface 181a with respect to the one surface 111 of the TFT substrate 110 may be various according to necessity.

The first cutting surface 181a may be formed by cutting or etching a portion of the part where the one surface 111 and the side surface 112 of the TFT substrate 110 are in contact with each other. As an edged portion of about 90 degrees formed of the one surface 111 and the side surface 112 are cut and the first cutting area 181a is formed, the connection wirings 170 can be formed in contact with the first cutting surface 181a including sufficient surface area to contact the connection wirings 170.

Accordingly, the connection wirings 170 can be stably contacted to the first cutting surface 181a, and at least a second thickness t2 of a predetermined range or higher of the connection wirings 170 formed on the first cutting surface 181a can be formed, and stable electrical signal transfer between the first connection pad 121 and the second connection pad 123 can be possible.

As the first cutting surface 181a is formed, an abrupt angle change of the one surface 111 and the side surface 112 of the TFT substrate 110 can be reduced, thereby enabling stable formation of the connection wirings 170, and by increasing the thickness uniformity of the connection wirings 170, current concentration can be avoided.

By forming the first cutting surface 181a, the thickness td of the edge area (DA) where the first cutting surface 181a is formed can be thinner than the thickness ta of the active area (AA).

The distance from the central line (g) to the one surface 111 or the other surface 113 can be greater than the distance from the central line (g) to the first cutting surface 181a.

Accordingly, the distance between the first connection pad 121 and the second connection pad 123 can be reduced by forming the first cutting surface 181a, and an electrical signal between the first connection pad 121 and the second connection pad 123 can be more stably transferred.

Figure 4:
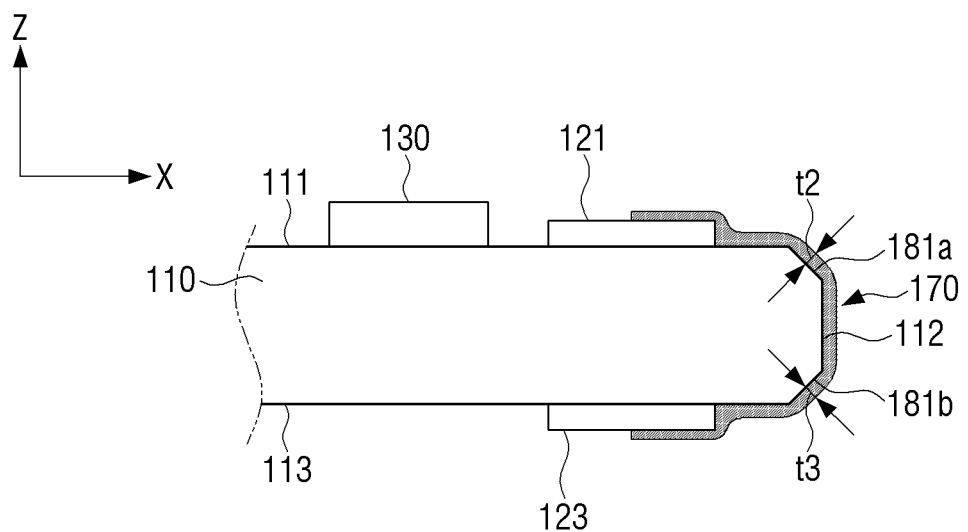
FIG. 4 is a modified embodiment of a structure of FIG. 3.

FIG. 4 is a modified embodiment of a structure of FIG. 3.

Referring to FIG. 4, an embodiment of a modification of the cutting surface will be described in greater detail.

The cutting area (CA) can be formed in the edge area (E2) of the other surface 113 of the TFT substrate 110.

Specifically, the second cutting surface 181b may be formed between the other surface 113 and the side surface 112 of the TFT substrate 110 and may be formed by cutting a portion of the part where the other surface 113 and the side surface 112 of the TFT substrate 110 are contact with each other.

The second cutting surface 181b may be formed to be inclined at a predetermined angle relative to the other surface 113 of the TFT substrate 110.

An angle at which the second cutting surface 181b is inclined relative to the other surface 113 of the TFT substrate 110 can be various angles as needed, and the angle can be the same as the angle at which the first cutting surface 181a is inclined relative to the one surface 111 of the TFT substrate 110, and may be different as needed.

Since the edged portion of about 90 degrees which is formed of the other surface 113 and the side surface 112 is cut and the second cutting surface 181b is formed, the connection wirings 170 can be formed in contact with the second cutting surface 181b which includes sufficient surface area to contact the connection wirings 170.

Accordingly, in the same manner as the first cutting surface 181a, the connection wirings 170 can be stably contacted to the second cutting surface 181b, and as the third thickness t3 of the connection wirings 170 formed on the second cutting surface 181b is increased, the stable electrical signal transfer between the first connection pad 121 and the second connection pad 123 may be possible.

Figure 5:
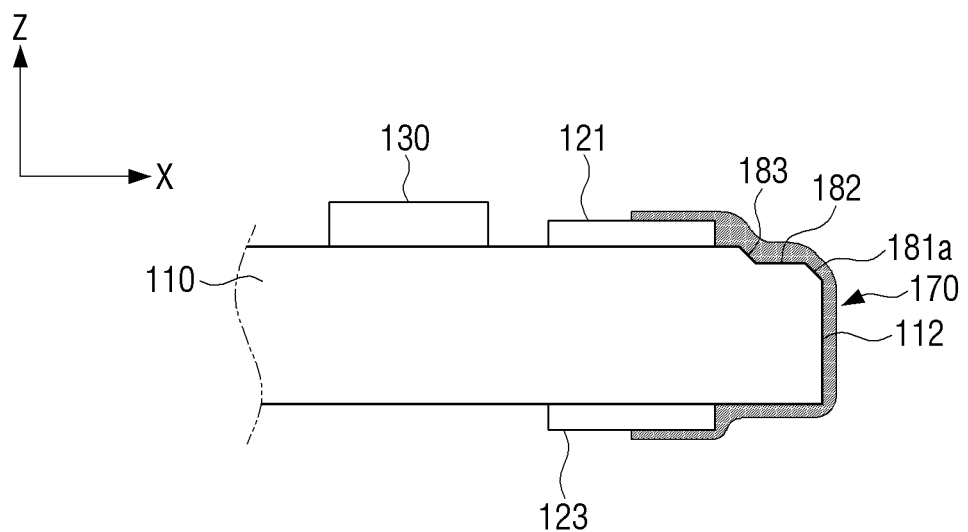
FIG. 5 is a modified embodiment of a structure of FIG. 3.

FIG. 5 is a modified embodiment of a structure of FIG. 3.

Referring to FIG. 5, another embodiment of modification of the cutting surface will be described in detail.

The cutting area (CA) can be formed as a multi-stage including the first cutting surface 181a, the third cutting surface 182, and a fourth cutting surface 183.

Specifically, the first cutting surface 181a may be formed to be inclined at a predetermined angle with respect to the one surface 111 of the TFT substrate 110 and the third cutting surface 182 can be formed consecutively with the first cutting surface 181a and formed in parallel with the one surface 111 of the TFT substrate 110, and the fourth cutting surface 183 may be consecutively connected with the third cutting surface 182 and may be formed to be inclined at a predetermined angle with respect to the one surface 111 of the TFT substrate 110.

At this time, an angle at which the first cutting surface 181a and the fourth cutting surface 183 are inclined relative to the one surface 111 of the TFT substrate 110 may be the same and may be different from each other as needed.

The fourth cutting surface 183 is not limited to being parallel to the one surface 111 of the TFT substrate 110, and may be inclined relative to the one surface 111 of the TFT substrate 110 as needed.

Accordingly, the first cutting surface 181a, the third cutting surface 182, and the fourth cutting surface 183 are formed between the one surface 111 and the side surface 112 of the TFT substrate 110, so that the surface area where the connection wirings 170 can be arranged may be widen.

Accordingly, the connection wirings 170 can be stably disposed on the edge area (DA) of the TFT substrate 110 and can be formed to a thickness required on the first cutting surface 181a, the third cutting surface 182, and the fourth cutting surface 183 so that stable electrical signal transfer between the first connection pad 121 and the second connection pad 123 can be possible.

The first cutting surface 181a, the third cutting surface 182, and the fourth cutting surface 183 are formed between the one surface 111 and the side surface 112 of the TFT substrate 110, so that the distance between the first contact pad 121 and the second contact pad 123 may be shortened.

Accordingly, an electrical signal between the first contact pad 121 and the second contact pad 123 may not be lost and can be rapidly transferred between the first contact pad 121 and the second contact pad 123.

Referring to FIG. 5, the first cutting surface 181a, the third cutting surface 182, and the fourth cutting surface 183 are formed between the one surface 111 and the side surface 112 of the TFT substrate 110, but as needed, the same shape as the first cutting surface 181a, the third cutting surface 182, and the fourth cutting surface 183 can be formed between the other surface 113 and the side surface 112 of the TFT substrate 110.

Figure 6:
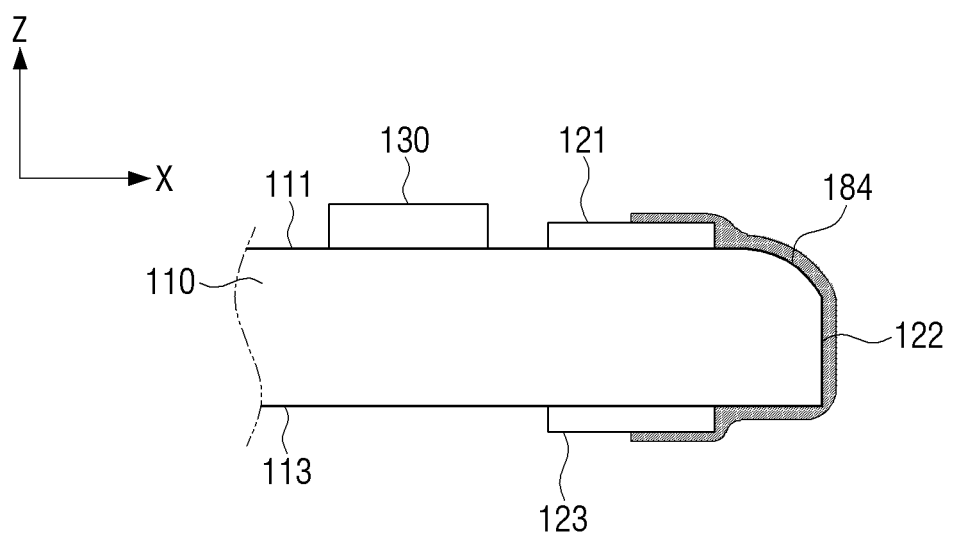
FIG. 6 is another modified embodiment of a structure of FIG. 3.

FIG. 6 is another modified embodiment of a structure of FIG. 3.

Referring to FIG. 6, another embodiment of modification of the cutting surface will be described in detail.

The cutting area (CA) can be formed to be curved.

The cutting area (CA) may include a fifth cutting surface 184 which is formed between the one surface 111 and the side surface 112 of the TFT substrate 110 and has a preset curvature.

Accordingly, the connection wirings 170 disposed on the fifth cutting surface 184 have no drastic change in a stepped portion, so that the connection wirings 170 can be stably disposed on the fifth cutting surface 184.

The shortest distance between the first connection pad 121 and the second connection pad 123 may be shortened and the loss of current and signal transmitted between the first connection pad 121 and the second connection pad 123 can be reduced.

Referring to FIG. 6, the fifth cutting surface 184 is formed between the one surface 111 and the side surface 112 of the TFT substrate 110, but the same shape as the fifth cutting surface 184 may be formed between the other surface 113 and the side surface 112 of the TFT substrate 110 as needed.

As described above, the connection wirings 170 may be disposed at the edge area (A) including at least one cutting surface 180, and may have a shape corresponding to the shape of the cutting surface 180.

Specifically, the connection wirings 170 can be formed in a shape corresponding to an outer surface with a certain thickness relative to the outer surface of the TFT substrate 110 formed of a portion of the edge area of the one surface 111, a portion of the edge area of the other surface 113, the side surface 112, and the cutting surface of the TFT substrate 110 on which the connection wirings 170 are arranged.

The connection wirings 170 may be formed consecutively on the one surface 111, the other surface 113, and the cutting surface 180.

By cutting or etching the cutting surface 180 variously in consideration of durability, conductivity, or the like, of the connection wirings 170, the shape of the connection wirings 170 can be configured in a diverse manner.

Figure 7:
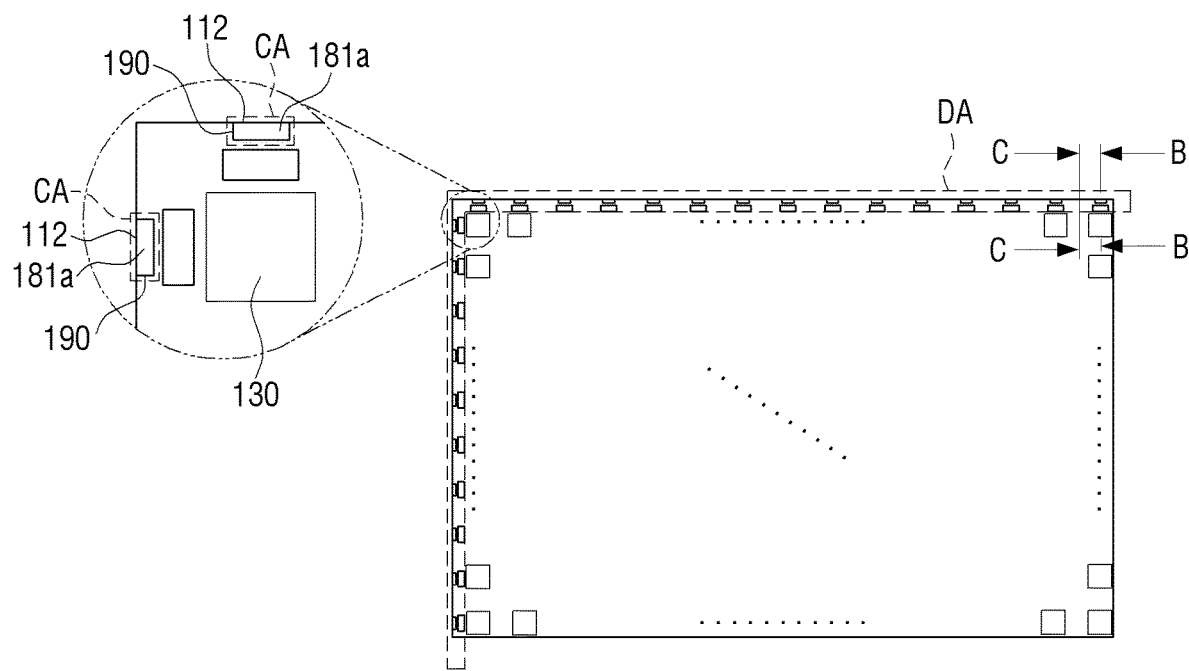
FIG. 7 is a front view where a plurality of connection wirings of FIG. 1 are omitted.
Figure 8:
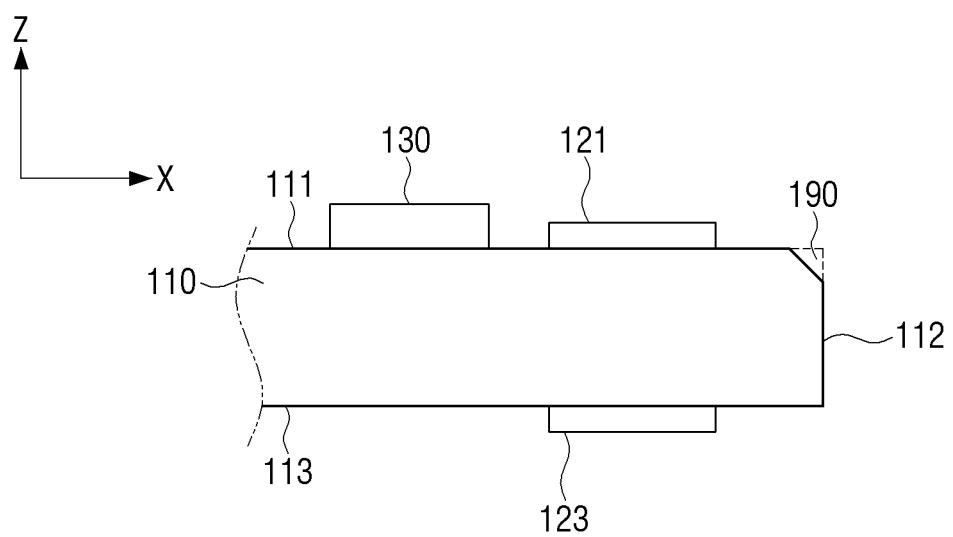
FIG. 8 is a cross-sectional view illustrated along B-B line of FIG. 7.
Figure 9:
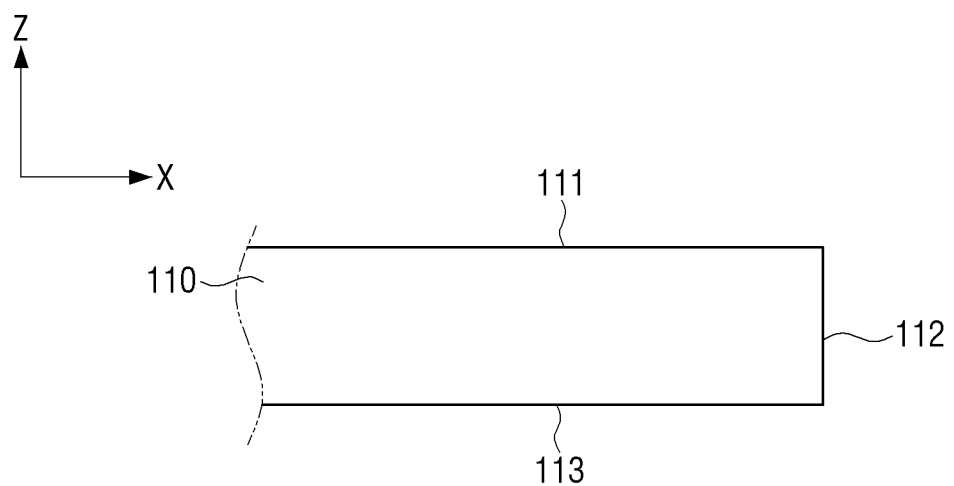
FIG. 9 is a cross-sectional view illustrated along C-C line of FIG. 7.

FIG. 7 is a front view where a plurality of connection wirings 170 of FIG. 1 are omitted, FIG. 8 is a cross-sectional view illustrated along B-B line of FIG. 7, and FIG. 9 is a cross-sectional view illustrated along C-C line of FIG. 7.

Referring to FIGS. 7 to 9, a structure of arranging the cutting area (CA) on the display panel 100 will be described in detail.

As illustrated in FIG. 7, the cutting area (CA) can be disposed on an area where the plurality of connection wirings 170 are arranged among the edge area (DA) of the TFT substrate 110.

The cutting area (CA) including at least one cutting surface 180 may be disposed with a predetermined interval along the length direction of the edge area (DA) of the TFT substrate 110.

More specifically, each cutting area (CA) can be arranged at a location corresponding to a location where a plurality of first connection pads 121 disposed on the one surface 111 of the TFT substrate 110 and a plurality of second connection pads 123 disposed on the other surface 113 of the TFT substrate 110 to face the first connection pads 121 are disposed.

Accordingly, the cutting area (CA) including the first cutting surface 181a may include a wiring groove 190 where the connection wirings 170 can be disposed.

As illustrated in FIG. 8, the wiring groove 190 refers to a space which is formed due to cut portion from the edge area (DA) of the TFT substrate 110.

Therefore, when the wiring groove 190 including a first cutting surface 181a is formed on the edge area (DA) of the TFT substrate 110, the connection wirings 170 can be formed in the wiring groove 190 and forming the stable position of the connection wirings 170 is possible.

As shown in FIG. 7, which is a top view, the shape of the wiring groove 190 is shown in a rectangular shape, but can be various shapes such as polygonal, circular, elliptical, etc. including a trapezoid as needed.

The cutting area (CA) is not limited to including the first cutting surface 181a, and can include various shapes of cutting surfaces 180 including the second to fifth cutting surfaces 181a, 181b, 182, 183, and 184 described above.

As shown in FIG. 8, the cutting area (CA) including the first cutting surface 181a may be selectively formed at a location corresponding to the location in which the first connection pad 121 is formed, and as shown in FIG. 9, the first cutting surface 181a may not be formed in the position between the first connection pads 121 e.g., at the edge area (DA) of the TFT substrate 110 where the first connection pads 121 are not formed.

Accordingly, the connection wirings 170 may be formed in the first cutting surface 181a formed in a location adjacent to the first connection pad 121, thereby enabling to form a stable positon of the connection wirings 170.

Figure 10:
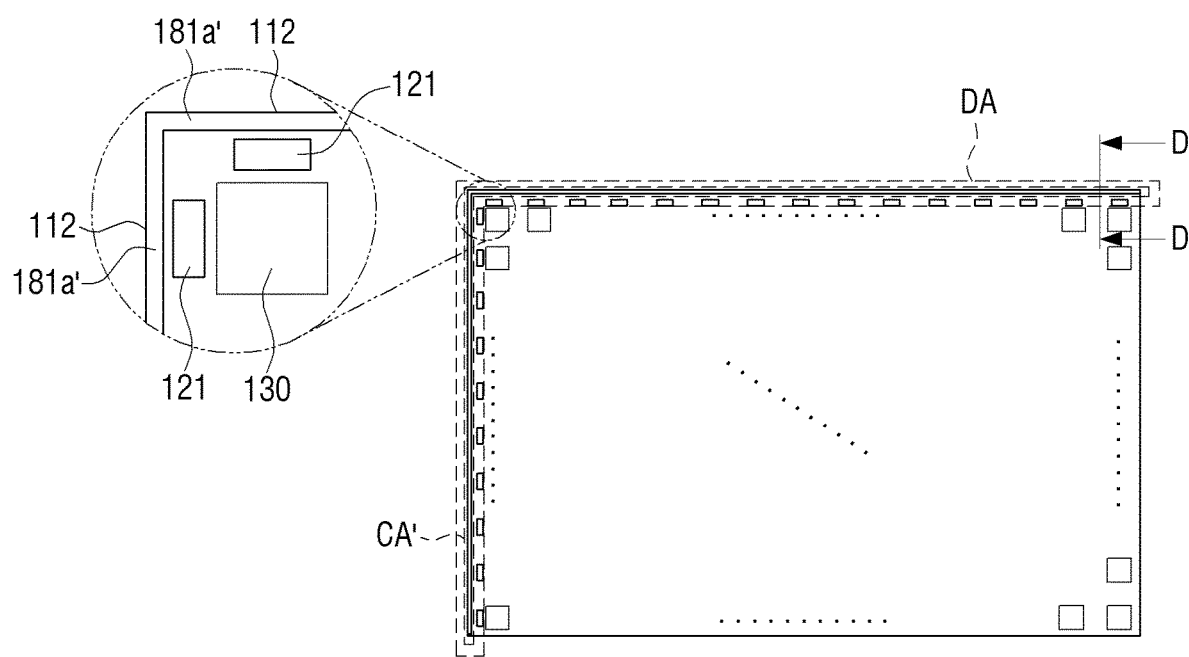
FIG. 10 is a front view illustrating a display panel according to another embodiment.
Figure 11:
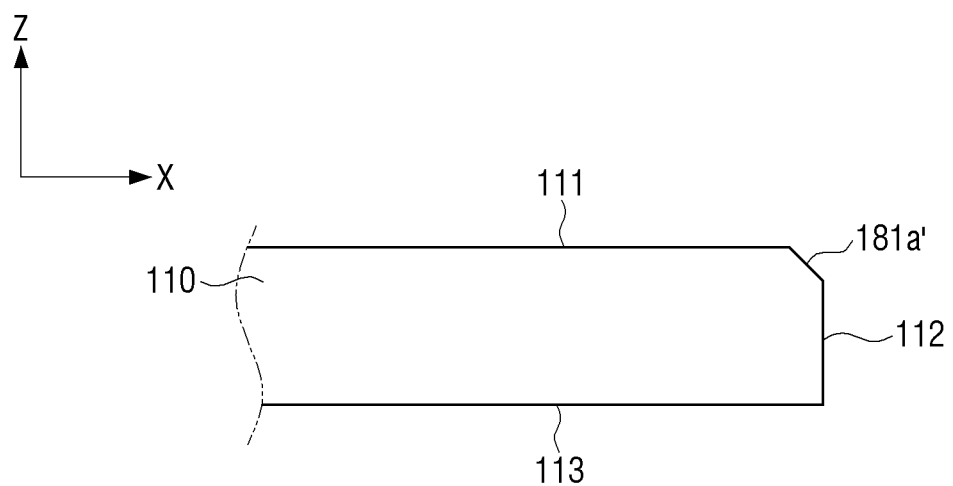
FIG. 11 is a cross-sectional view illustrated along D-D line of FIG. 11.

FIG. 10 is a front view illustrating a display panel 100' according to another embodiment and FIG. 11 is a cross-sectional view illustrated along D-D line of FIG. 11.

Hereinafter, a structure including a sixth cutting surface 181a' formed consecutively along the length direction of the edge area (DA) of the TFT substrate 110 will be described with reference to FIGS. 10 to 11.

A same configuration as the first connection pad 121 and the single pixel 130 has a same reference numeral and a redundant description will be omitted.

As illustrated in FIG. 10, a cutting area (CA') can be formed consecutively along a length direction of the edge area (DA) of the TFT substrate 110.

The cutting area (CA') may refer to an area including the sixth cutting surface 181a'.

The sixth cutting surface 181a' may be formed at a predetermined angle with respect to the one surface 111 of the TFT substrate 110 in the same manner as the first cutting surface 181a. However, unlike the first cutting surface 181a, the sixth cutting surface 181a' is consecutively formed along the length direction of the TFT substrate 110 and thus is different.

As shown in FIG. 11, the sixth cutting surface 181a' may be formed in a position between a plurality of first connection pads 121, that is, an edge area (DA) of the TFT substrate 110 where the first connection pad 121 is not formed.

Accordingly, as shown in FIG. 7, the cutting area (CA) is selectively formed on the edge area (DA), while the cutting area (CA') shown in FIG. 11 can be consecutively formed along the length direction of the edge area (DA).

Accordingly, in comparison to selectively forming the sixth cutting surface 181a' in the edge area (DA), the sixth cutting surface 181a' can be consecutively and consistently formed in the edge area (DA), thereby simplifying the manufacturing process and shortening manufacturing time.

The cutting surface is not limited to the sixth cutting surface 181a' and can be formed as the cutting surface 180 in various shapes.

Although various embodiments of the disclosure have been described separately, each embodiment is not necessarily to be implemented alone, and the construction and operation of each embodiment may be implemented in combination with at least one other embodiment.

Although example embodiments have been shown and described, it will be appreciated by those skilled in the art that changes may be made to these example embodiments without departing from the principles and spirit of the disclosure. Accordingly, the scope of the disclosure is not to be understood as being limited to the various example embodiments, but is defined, for example, by the appended claims as well as equivalents thereto.

What is claimed is:

1. A display panel comprising: a thin film transistor substrate; a plurality of micro light emitting diodes (LEDs) arranged on one surface of the thin film transistor substrate; a plurality of first connection pads disposed on the one surface of the thin film transistor substrate; a plurality of second connection pads disposed on the other surface of the thin film transistor substrate that faces the one surface; and a plurality of connection wirings disposed on a side surface of the thin film transistor substrate for electrically connecting each of the plurality of first connection pads and the plurality of second connection pads, wherein at least one edge area of an edge area on the one surface and an edge area on the other surface of the thin film transistor substrate includes a cutting area which is cut in an inward direction of the thin film transistor substrate, wherein the cutting area is formed to have a multi-stage structure, the multi-stage structure comprising a plurality of cutting surfaces consecutively arranged between the side surface and the one surface or the other surface, wherein one or more of the cutting surfaces of the cutting area are formed by cutting or etching a portion of the cutting area between the side surface and the one surface or the other surface to receive a respective one of the plurality of connection wirings, and wherein the plurality of connection wirings are metal deposited along the multi-stage structure of the cutting area.

2. The display panel of claim 1, wherein one or more of the cutting surfaces of the cutting area is formed to be inclined.

3. The display panel of claim 1, wherein one or more of the cutting surfaces of the cutting area is formed to be curved.

4. The display panel of claim 1, the cutting area is disposed on an area where the plurality of connection wirings are disposed among the edge areas of the thin film transistor substrate.

5. The display panel of claim 4, wherein the plurality of first connection pads are disposed at a preset interval along a length direction of an edge area of the one surface, respectively and wherein the plurality of second connection pads are disposed to face the plurality of first connection pads, respectively.

6. The display panel of claim 1, wherein the cutting area is consecutively formed along a length direction of the edge area of the thin film transistor substrate.

7. The display panel of claim 1, wherein the connection wirings are consecutively formed on the one surface, the other surface, and the cutting surface.

8. The display panel of claim 7, wherein the connection wirings include a shape corresponding to a shape of the cutting surface.

* * * * *